United States Patent [19]

Arnoux et al.

[11] Patent Number: 4,590,421
[45] Date of Patent: May 20, 1986

[54] MEASURING ATTACHMENT CONNECTIBLE TO A MULTIMETER FOR MEASURING EARTH RESISTANCES

[75] Inventors: Daniel Arnoux, St. Germain en Laye; Jean Bousquet, Domont; Claude Genter, Paris, all of France

[73] Assignee: Chauvin Arnoux, Paris, France

[21] Appl. No.: 549,457

[22] Filed: Nov. 7, 1983

[30] Foreign Application Priority Data

Nov. 10, 1982 [FR] France .................. 82 18860

[51] Int. Cl.⁴ .................. G01R 27/02; G01R 27/26
[52] U.S. Cl. .................. 324/62
[58] Field of Search .................. 324/149, 51, 52, 62 R, 324/57 R, 133

[56] References Cited

U.S. PATENT DOCUMENTS

| 3,501,694 | 3/1970 | Ito | 324/62 R |
| 4,200,835 | 4/1980 | Anahara | 324/51 |
| 4,209,741 | 6/1980 | Coby | 324/62 R |
| 4,415,850 | 11/1983 | Sherwood | 324/51 |
| 4,446,424 | 5/1984 | Chatanier | 324/62 R |

FOREIGN PATENT DOCUMENTS 1482137 8/1977 United Kingdom .................. 324/149

OTHER PUBLICATIONS

Messen und Prüfen Vereinigt mit Automatik, vol. 16, May 1980, pp. 306-308, Wörishofen (DE); Article by U. Oppelt.
Radio Mentor Electronic, vol. 44, No. 2, Feb. 1978, pp. 70, 71, München (DE); Article "Metrix Meint Multimeter"; left Figure on p. 70.
Hewlett-Packard Journal, vol. 28, No. 1, Sep. 1976, pp. 9-15, Palo Alto (USA); S. Hashimoto et al.
BBC-Nachrichten, vol. 54, No. 9/10, Sep./Oct. 1972, pp. 241-252, Mannheim (DE); Article by K. O. Hoffmann.
Elektronik, vol. 18, No. 5, May 1969, pp. 135-137, München (DE); Article by K. H. Krämer et al.

Primary Examiner—Stanley T. Krawczewicz
Assistant Examiner—Jose M. Solis
Attorney, Agent, or Firm—Gottlieb, Rackman & Reisman

[57] ABSTRACT

The invention provides a measuring attachment connectible to a multimeter for measuring earth resistances, comprising a casing having a first group of terminals for a measurement signal and a second group of terminals for electrical connection of the attachment to a multimeter, and electric circuits housed in the casing and comprising generator means for generating an AC current of constant value but of a frequency different from that of the mains and its harmonics, said generator means having an output connected to first and second terminals of said first group of terminals, and a synchronous detector having a measurement signal input which is connected to said second terminal and to a third terminal of said first group of terminals, a control input which is connected to said generator means and an output which is connected to first and second terminals of said second group of terminals.

5 Claims, 2 Drawing Figures

MEASURING ATTACHMENT CONNECTIBLE TO A MULTIMETER FOR MEASURING EARTH RESISTANCES

BACKGROUND OF THE INVENTION

1. Field of the Invention

The present invention relates to a measuring attachment connectible to a multimeter for measuring earth resistances, of the type comprising a casing having a first group of terminals for a measurement signal and a second group of terminals for the electrical connection of the attachment to the multimeter, and electric circuits housed in the casing and connected electrically to the terminals of the first and second groups of terminals.

2. Description of the Prior Art.

Grounding or earthing of the masses of household and industrial electric appliances is required by regulations for ensuring the safety of the users of such appliances.

The efficiency of this earthing is considered satisfactory if the voltage to which the accessible metal parts (mass) are raised does not exceed a certain threshold $U_s$ (generally fixed at 24 V) should there be a defect in the installation. Since the defect currents themselves are limited by the value of the current $I_d$ for tripping the protection apparatuses, it is clear that the efficiency of earthing will be related to not overshooting a resistance value defined by the quotient $U_s/I_d$.

So it is necessary, to satisfy the requirements of safety regulations, to measure the resistance of earth tappings not only at the time of initial installation, but also subsequently so as to be sure that they maintain their quality.

This measurement however requires, to be significant, to be carried out according to an appropriate procedure;

(1) Using an AC current for eliminating the effect of biasing voltages.

(2) Choosing for this current a frequency different from that of the mains and its harmonics.

(3) Providing effective filtering of parasitic AC and DC voltages to bring them to a level which does not disturb the measurement.

These requirements have led to the construction of measuring apparatus specialized in measuring earth resistances and relatively cumbersome.

On the other hand digital or analog multimeters are known, to which various attachments may be connected for increasing the number of ranges and/or functions of the multimeter. Such multimeters are, for example commercialized by the firm Chauvin Arnoux under the names "CONPA 2010", "CONPA 2011" and "CONTA 20011". With these multimeters, the firm Chauvin Arnoux commercializes a number of plug-in attachments which, when they are connected to the multimeter confer thereon the following functions: thermometer, luxmeter/luminance meter, frequency meter, voltage or current generator, capacitance meter sonometer, ammeter for measuring high value AC or DC currents. However, to the knowledge of the Applicant, an attachment has not yet been proposed to be connected to a multimeter for measuring earth resistances with the multimeter.

SUMMARY OF THE INVENTION

The object of the present invention is to provide an attachment taking up little space, able to be connected to a general purpose digital or analog multimeter and comprising the electric circuits required for measuring earth resistances by means of said multimeter.

To this end, the present invention provides an attachment in which said electric circuits comprise generator means for generating an AC current of constant value and of different frequency from that of the mains and its harmonics, said generator means having an output connected to first and second terminals of the first group of terminals, and a detector circuit having a measurement signal input which is connected to the second and to a third terminal of the first group of terminals, and an output which is connected to first and second terminals of the second group of terminals.

In a preferred embodiment of the present invention, usable with a multimeter having a multi-temrminal connector, at two terminals of which the voltage of a battery incorporated in the multimeter is available, the casing of the attachment is itself equipped, in a known manner, with a multi-terminal connector complementary to that of the multimeter In this case, two of the terminals of the connector of the casing form said first and second terminals of the second group of terminals, and two other terminals of the connector of the casing, which correspond to the two terminals of the connector of the multimeter at which the voltage of the battery is available, are connected to the AC current generator means for its current supply. In other words, the electric circuits of the attachment are supplied with current from the battery of the multimeter, which means that a battery is not needed inside the casing of the attachment, thus contributing to reduce its dimensions and weight and facilitating use thereof. The small space taken up by the attachment, which constitutes a determining quality thereof, may further be obtained by using integrated circuits for a good part of the active electronic components coming into the construction of the electric circuits of the attachment.

BRIEF DESCRIPTION OF THE DRAWINGS

There will now be described a preferred embodiment of the invention with reference to the accompanying drawing in which.

DETAILED DESCRIPTION OF THE PREFERRED EMBODIMENT

Figure 1:
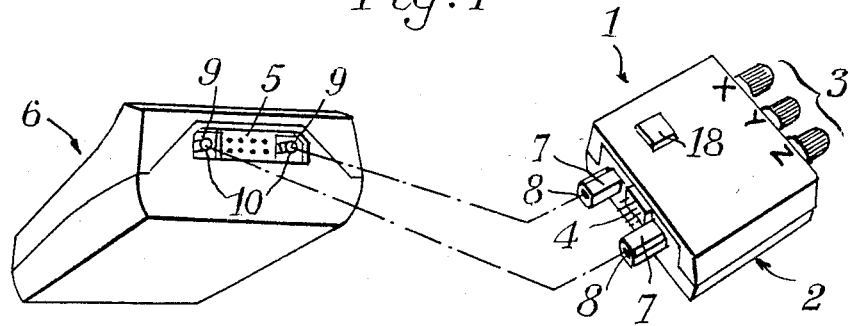
FIG. 1 shows in a perspective view the casing of the attachment of the present invention, as well as the multimeter to which it may be connected for measuring earth resistances.

The attachment 1 shown in FIG. 1 comprises a casing 2 approximately parallelepipedic in shape, on the rear face of which is disposed a first group 3 of three terminals X, Y and Z and on the front face of which is fixed a male connector 4 forming a second group of terminals of attachment 1.

Terminal X is intended to be connected by a conductor (not shown) to a earth tapping the resistance of which is to be measured. Terminal Y is intended to be connected by a conductor (not shown) to an auxiliary reference ground potential tapping. Terminal Z is intended to be connected by a conductor (not shown) to a current injection tapping in the ground. The three above-mentioned tappings may comprise, in a known manner, ground stakes.

The male connector 4 may be plugged into a female connector 5 of a multimeter 6 such, for example, as a digital multimeter model "CONPA 2010" of the firm Chauvin Arnoux. Two indexing lugs 7, each having an axial hole 8, project from the front face, of casing 2 on each side of the male connector 4. The two lugs 7 and their holes 8 may be engaged respectively in cavities 9, having pins 10 therein, which are provided in the casing of the multimeter 6 on each side of the female connector 5. Lugs 7 allow the casing 2 of the multimeter 6 and, at the same time, they position the contact plugs of the male connector 4 with respect to the contact sockets of the female connector 5, thus facilitating plugging-in of the male connector 4 into the female connector 5 when the attachment 1 is mounted on the multimeter 6.

The multimeter contains, in a known manner, a supply battery (not shown) the positive and negative terminals of which are connected respectively to two of the terminals or sockets of the female connector 5. Two other terminals or sockets of the female connector 5 serve as input terminals for a DC signal the voltage of which is to be measured, when the range and function selector switch of the multimeter is in a position corresponding to a DC voltage measurement.

Figure 2:
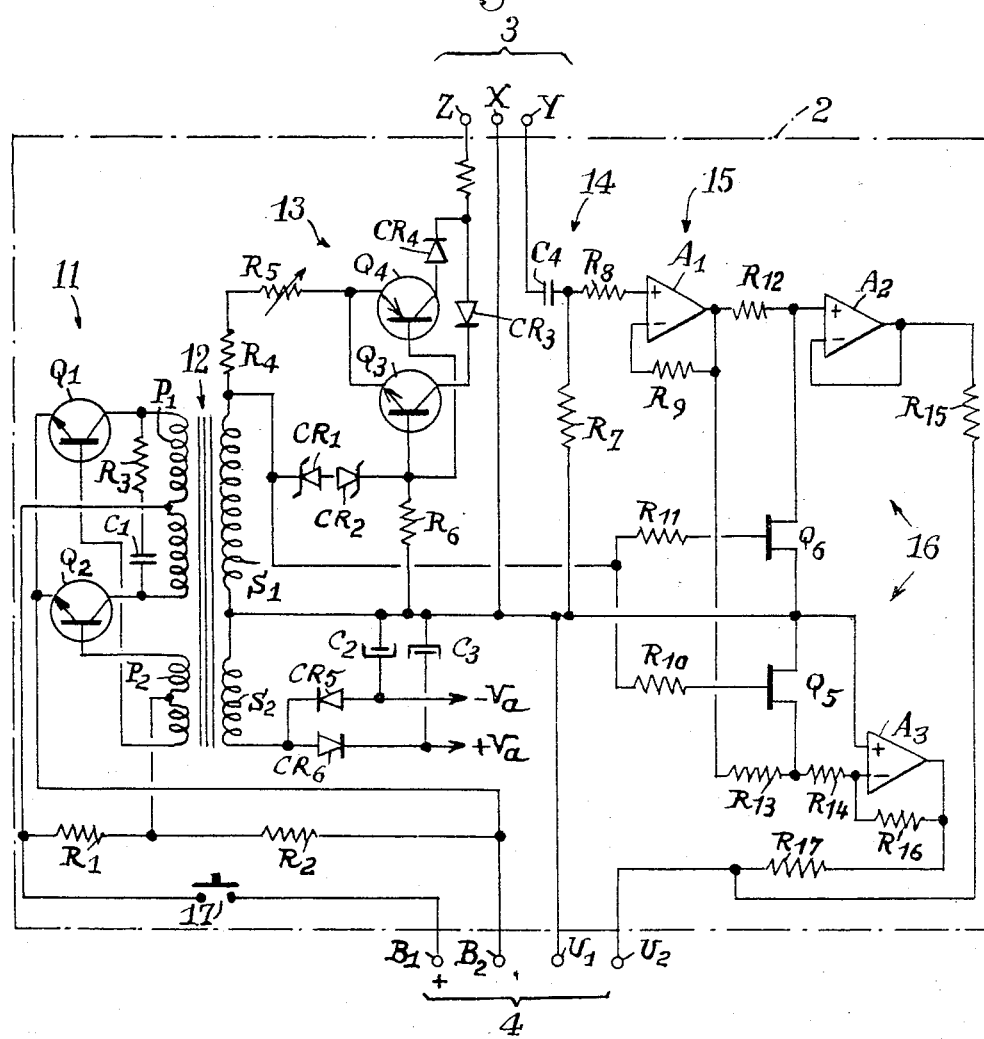
FIG. 2 is a diagram showing the electric circuits of the attachment of the present invention.

FIG. 2 show the electric circuits of the attachment 1. The latter comprises essentially, on the one hand, an oscillator circuit 11, a transformer 12 and a current regulator 13 which form together a generator producing an AC current of constant value and, on the other hand, a filter 14, a buffer amplifier 15 and a synchronous detector 16 which process the measurement signal before it is applied to the multimeter 6.

Oscillator 11 comprises two npn transistors $Q_1$ and $Q_2$ having their collectors connected respectively to the ends of the primary center-tapped winding $P_1$ of transformer 12, the center-tapping of winding $P_1$ being connected through a switch 17 to a terminal $B_1$ of male connector 4 which is connected through the female connector 5 to the positive terminal of the battery of multimeter 6. Switch 17 is for example a push button switch the push button 18 of which projects through the upper face of casing 2 of the attachment 1 (FIG. 1). The emitters of transistors $Q_1$ and $Q_2$ are connected directly to a terminal $B_2$ of the male connector 4, which is connected through the female connector 5 to the negative terminal of the battery of multimeter 6. The bases of transistors $Q_1$ and $Q_2$ are connected respectively to the ends of the center-tapped feedback winding $P_2$ of transformer 12. The center-tapping of winding $P_2$ is connected to the junction point between two resistors $R_1$ and $R_2$ which are connected in series between terminals $B_1$ and $B_2$ and which form a voltage divider for biasing the bases of transistors $Q_1$ and $Q_2$. A capacitor $C_1$ and a resistor $R_3$ are connected in series between the ands of the primary winding $P_1$ of transformer 12.

Windings $P_1$ and $P_2$, transistors $Q_1$ and $Q_2$, capacitor $C_1$ and resistor $R_3$ form a symmetrical relaxation oscillator of a known type. The oscillation frequency is defined by the magnetic characteristics of the core of transformer 12, the inductance of winding $P_1$, the capacity of capacitor $C_1$ and the voltage of the supply battery. The components are chosen so that the oscillation frequency is in a range of 130 to 230 Hz which is favorable for measuring earth resistances. The oscillation frequency must however be chosen different from 150 and 200 Hz, i.e. different from the third and fourth harmonics of the mains (50 Hz).

The current regulator circuit 13 comprises a npn transistor $Q_3$ and a pnp transistor $Q_4$, the emitters of which are connected through two series resistors $R_4$ and $R_5$ to one of the ends of the secondary winding $S_1$ of transformer 12. The bases of transistors $Q_3$ and $Q_4$ are connected on the one hand to the above-mentioned end of the secondary winding $S_1$ through two Zener diodes $CR_1$ and $CR_2$ connected in opposition, and, on the other hand to the other end of the secondary winding $S_1$ through a resistor $R_6$. The collector of transistor $Q_3$ is connected to the cathode of a diode $CR_3$ having its anode connected to terminal Z through a resistor (not designated), whereas the collector, of transistor $Q_4$ is connected to the anode of a diode $CR_4$ having its cathode connected to terminal Z through said resistor.

Said other end of the secondary winding $S_1$ of transformer 12 is connected directly, on the one hand, to terminal X of the group 3 of three terminals and, on the other hand, to an output terminal $U_1$ of the male connector 4.

Filter 14 is formed by a capacitor $C_4$ having one armature plate connected to terminal Y of the group 3 of three terminals and its other armature plate connected through a resistor $R_7$ to terminal X. The junction point between capacitor $C_4$ and resistor $R_7$ is connected through a resistor $R_8$ to the positive (+) input of an operational amplifier $A_1$ having its output connected on the one hand to the negative (−) input of amplifier $A_1$ through a resistor $R_9$ and, on the other hand, to the input of the synchronous detector 16.

The synchronous detector 16 comprises essentially two operational amplifiers $A_2$ and $A_3$ and two field effect transistors $Q_5$ and $Q_6$, respectively of N Channel and P Channel type. Transistors $Q_5$ and $Q_6$ are controlled by the AC signal available at the ends of the secondary winding $S_1$ of transfdrmer 12. To this end, the gates of the two transistors $Q_5$ and $Q_6$ are connected respectively through resistors $R_{10}$ and $R_{11}$ to the junction point between resistor $R_4$ and the secondary winding $S_1$. The output of the operational amplifier $A_1$ is connected on the one hand through a resistor $R_{12}$ to the (+) input of the operational amplifier $A_2$ and, on the other hand, through series connected resistors $R_{13}$ and $R_{14}$ to the (−) input of the operational amplifier $A_3$. The (+) input of the operational amplifier $A_2$ is connected to terminal X through the source-drain path of transistor $Q_6$ when the latter is in a conducting state. The output of the operational amplifier $A_2$ is connected on the one hand directly to its (−) input and on the other hand, through a resistor $R_{15}$ to a terminal $U_2$ of the male connector 4. The (+) input of ther operational amplifier $A_3$ is connected directly to terminal X, wheresas its (−) input is connected to terminal X through resistor $R_{14}$ and through the source-drain path of transistor $Q_5$ when the latter is in a conducting state. The output of the operational amplifier $A_3$ is connected on the one hand through resistor $R_{16}$ to its (−) input and, on the other hand, through a resistor $R_{17}$ to terminal $U_2$.

Transformer 12 comprises another secondary winding $S_2$ having one end connected to the end of the secondary winding $S_1$ which is itself connected to terminals X and $U_1$, and having its other end connected to the cathode of a diode $CR_5$ and to the anode of a diode $CR_6$. These two diodes supply after filtering by capacitors $C_2$ and $C_3$ the DC voltages $-V_a$ and $+V_a$ required for operating the operational amplifiers $A_1$, $A_2$ and $A_3$.

With the attachment 1 which has been described above, the AC current which is injected through terminal Z into the earth the resistance of which is to be measured, is regulated in amplitude by transistors $Q_3$ and $Q_4$ associated with the Zener diodes $CR_1$ and $CR_2$ and with resistors $R_4$ and $R_5$. The resistor $R_5$ is an adjustable resistor so as to allow accurate adjustment of the constant value of the AC current which is injected into the earth through terminal Z. In fact, the value of this current determines the ratio between the output voltage and the earth resistance to be measured. In the embodiment described, this ratio is 1 mV/ohm, thus allowing the value of the earth resistance to be read directly in ohms on the 100 mV range of the multimeter and this value in kohms on the 1 volt range of the multimeter.

At its (+) input the operational amplifier $A_1$ is connected as a voltage follower so as to have a high input impedance. This high input impedance makes the measurement of the earth resistance independent of the resistance of the auxiliary reference ground potential tapping. Consequently, since the current I injected into the earth through terminal Z is constant and since the above-mentioned ratio between the output voltage and the resistance to be measured is 1 mV/ohm, the voltage RI taken between terminals X and Y constitutes a measurement of the earth resistance R to be measured. Furthermore, with the high input impedance of operational amplifier $A_1$ the resistance of the auxiliary reference ground potential tapping (terminal Y) may be of several kohms, without substantially disturbing the measurement.

The field effect transistors $Q_5$ and $Q_6$ associated with the operational amplifiers $A_2$ and $A_3$ provide synchronous rectification of the voltage taken from terminals X and Y. Resistors $R_{15}$ and $R_{17}$ provide summing of the half waves coming from amplifiers $A_2$ and $A_3$.

The galvanic insulation provided by transformer 12 between the supply battery for the multimeter and the output terminals $U_1$ and $U_2$ allows the latter to be connected to the multimeter without the operation thereof being disturbed.

By way of indication, the components of the circuits shown in FIG. 2 may be the following:

| | |
|---|---|
| $R_1 = 5.1$ k$\Omega$ | $C_1 = 1$ nf |
| $R_2 = 1$ k$\Omega$ | $C_2 = C_3 = 10$ $\mu$F |
| $R_3 = R_{12} = R_{13} = R_{14} = 10$ k$\Omega$ | $C_4 = 1$ $\mu$F |
| $R_4 = 1.15$ k$\Omega$ | $CR_1 = CR_2 =$ Zener 2.49 V |
| $R_5 = 220$ ohms | $CR_3 = CR_4 = CR_5 = CR_6 = 1N4148$ |
| $R_6 = 47$ k | $Q_1 = Q_2 = BD$ 519 |
| $R_7 = R_8 = 470$ k$\Omega$ | $Q_3 = MPSA$ 06 |
| $R_9 = R_{10} = R_{11} = 1$ M$\Omega$ | $Q_4 = MPSA$ 56 |
| $R_{15} = R_{16} = R_{17} = 20$ k$\Omega$ | $Q_5 = J$ 112 |
| | $Q_6 = J$ 176 |

$A_1$, $A_2$, $A_3$ = quadruple operational amplifier RC 4156DB.

It goes without saying that the embodiment of the present invention which has been described above by way of example is purely by way of indication and in no wise limiting, and that numerous modifications may be readily made thereto by a man skilled in that art without departing from the scope and spirit of the invention. Thus, particularly in the case where the multimeter is not equipped with a female connector such as connector 5, at two terminals of which the voltage of the battery of the multimeter is available, but only with conventional input terminals for the signals to be measured, the casing 2 will not comprise the male connector 4 and lugs 7. Instead, casing 2 will comprise two terminals (the output terminals $U_1$ and $U_2$) in the form of sockets connectible to the input terminals of the multimeter by suitable connecting conductors. Furthermore, a supply battery will have to be provided inside the casing of the attachment.

It is also possible to replace the synchronous detector 16 described above by a conventional asynchronous rectifier circuit. In this case, to compensate for the absence of filtering which results therefrom, particularly with respect to parasitic voltages at the frequency of the mains, it is advisable to introduce a suitable filtering circuit at the measuring input Y and upstream of the rectifier.

What is claimed is:

1. Measuring attachment connectible to a multimeter for measuring and direct reading earth resistances, comprising a casing having a first group of three terminals for an AC signal to be injected into the earth and for a measurement signal, and a second group of terminals for electrical connection of the attachment to the multimeter, and electric circuits housed in the casing and connected electrically to the terminals of the first and second groups of terminals, said electric circuits comprising generator means for generating, as said AC signal, and AC current of constant predetermined value and of a frequency different from that of the mains and its harmonics, said generator means having an output connected to first and second terminals of said first group of terminals, and a detector circuit having a measurement and to a third terminal of said first group of terminals, signal input which is connected to the second terminal and an output which is connected to first and second terminals of said second group of terminals.

2. Measuring attachment according to claim 1, for a multimeter having a battery incorporated therein and having a multi-terminal connector, at two terminals of which the voltage of the battery is available, wherein the casing of the attachment has a multi-terminal connector complementary to that of the multimeter, two of the terminals of the connector of the casing form said first and second terminals of said second group of terminals and two other terminals of the connector of the multimeter at which the voltage of the battery is available, are connected to the AC current generator means for its current supply.

3. Measuring attachment according to claim 1, wherein said AC current generator means comprises a transformer having a primary winding, a secondary winding and a feedback winding, a transistor oscillator circuit connected to said primary and feedback windings of said transformer for producing an AC voltage at the ends of said secondary winding, and an AC current regulating circuit connected between a first end said secondary winding and said first terminal of said first group of terminals, the second end of said secondary winding being connected directly to said second terminal of said second group of terminals.

4. Measuring attachment according to claim 3, wherein said electric circuits comprise a filter and a buffer amplifier connected in series between said second and third terminals of said first group of terminals and the measurement signal input of said detector circuit.

5. Measuring attachment according to claim 4, wherein said detector circuit is a synchronous detector having a control input which is connected to said generator means, said buffer amplifier and said synchronous detector comprise operational amplifiers, said transformer comprises another secondary winding and a rectifier circuit is connected to said other secondary winding to produce at least one DC supply voltage for said operational amplifiers.

* * * * *